United States Patent [19]

Saito

[11] Patent Number: 5,545,436
[45] Date of Patent: Aug. 13, 1996

[54] CVD METHOD AND APPARATUS FOR MAKING SILICON OXIDE FILMS

[75] Inventor: Masaki Saito, Kanagawa, Japan

[73] Assignee: Sony Corporation, Tokyo, Japan

[21] Appl. No.: 336,054

[22] Filed: Nov. 4, 1994

[30] Foreign Application Priority Data

Nov. 12, 1993 [JP] Japan ................................. 5-282998

[51] Int. Cl.⁶ ................................................. C23C 16/00
[52] U.S. Cl. ................................. 427/255.3; 427/255.1; 427/255.2; 427/255.5; 118/715; 118/729
[58] Field of Search ....................... 427/255.3, 255.2, 427/255.1, 255.5, 579, 574, 248.1; 118/715, 729

[56] References Cited

U.S. PATENT DOCUMENTS

| | | | |
|---|---|---|---|
| 4,892,753 | 1/1990 | Wang et al. | 427/579 |
| 5,288,325 | 2/1994 | Gomi | 118/692 |
| 5,403,630 | 4/1995 | Matsui et al. | 427/583 |

*Primary Examiner*—Roy V. King
*Attorney, Agent, or Firm*—Hill, Steadman & Simpson

[57] ABSTRACT

A CVD system for accomplishing deposition of a silicon oxide film on a wafer which is moved in a predetermined direction, under a reaction between an organic Si source and $O_3$. The CVD system comprises a gas injector having a first slit for ejecting a gas containing $O_3$, a second slit for ejecting a gas which is inert to a reaction between the organic Si source and $O_3$, a third slit for ejecting a gas containing the organic Si source, a fourth slit for ejecting a gas which is inert to the reaction, a fifth slit for ejecting a gas containing the organic Si source, a sixth slit for ejecting a gas which is inert to the reaction, and a seventh slit for ejecting a gas containing $O_3$. Additionally, the first to seventh slits are arranged in the order named in the predetermined wafer moving direction. This CVD system improves the characteristics and quality of silicon oxide film deposited on the wafer while lowering a so-called substrate dependency of the deposited film.

6 Claims, 2 Drawing Sheets

CVD METHOD AND APPARATUS FOR MAKING SILICON OXIDE FILMS

BACKGROUND OF THE INVENTION

1. Field of the Invention

This invention relates to improvements in a CVD method and a CVD system accomplishing the method in order to deposit a silicon oxide film on a substrate under a reaction between an organic Si source and $O_3$, the method and system being usable in the field of production of semiconductor devices.

2. Description of the Prior Art

CVD (Chemical Vapor Deposition) methods are well known and used to deposit a silicon oxide ($SiO_2$) film on a substrate by using reaction between an organic Si source and ozone ($O_3$). Of these CVD methods, an atmospheric pressure TEOS(tetra ethoxy silane)-$O_3$-CVD method been extensively used. The silicon oxide film obtained by this CVD method has a characteristic to be able to effectively fill the narrow spaces between Al wirings in a highly integrated LSI without forming voids, and therefore attention has been paid to the silicon oxide film as a future insulating film between layers. In this CVD method, polymerization reaction of TEOS and oxygen radical produced under decomposition of $O_3$ is used in which oligomer as the polymer resulted from the polymerization reaction is different in its adsorption characteristics (to the substrate) depending upon the physical properties of the substrate on which the oligomer is to be deposited. For example, TEOS-$O_2$ plasma silicon oxide film which is hydrophilic and often used as the substrate (film) for the silicon oxide film produced by the atmospheric pressure TEOS-$O_3$-CVD method; however, the absorption of the oligomer or deposit to the surface of such a hydrophilic film is degraded during the film deposition so that the properties of the silicon oxide film deposited on the substrate film is lowered. This has been known, for example, from a Japanese monthly technical magazine "Semiconductor World, 1992, January, Pages 140 to 153".

There are two methods for supplying gases in the atmospheric pressure TEOS-$O_3$-CVD method. One is a premixing method in which used gases ($O_3$ and TEOS) are mixed with each other prior to supply to the surface of the substrate (film). This method requires a pretreatment such as a plasma treatment and an ethanol coating to the substrate (film) in order to improve a substrate dependency (dependency of adsorption characteristics of the deposit to the characteristics of the substrate) as seen from the graph of FIG. 1 indicating an etching rate (mm/min). In FIG. 1, (A) represents a case of film deposition under the pretreatment of ethanol coating onto a plasma TEOS; (B) a case of film deposition under the pretreatment of $N_2$ plasma onto a plasma TEOS; (C) a case of film deposition made on a plasma TEOS; and (D) a case of film deposition made on a bare Si substrate. The etching rate was measured upon the etching with buffered hydrofluoric acid. It will be understood that such a pretreatment unavoidably increases the number of production steps and production equipment cost.

Another method is a postmixing method in which mixing of used gases is made immediately above the surface of the substrate (film). More specifically, in this method, the used gases ($O_3$ and TEOS) are separated from each other by a curtain of inert gas such as $N_2$ and subsequently mixed with each other immediately above the surface of the substrate (film). It has been confirmed that the substrate dependency is improved by the postmixing method as compared with the premixing method.

A conventional plasma CVD system accomplishing the postmixing method is schematically illustrated in FIG. 2. In FIG. 2, a wafer W' is put on a conveyer belt 12' and moves from the left-hand side to the right-hand side or in a direction indicated by an arrow in the figure and will pass through a location under a gas injector 1'. The gas injector 1' supplies mixed gases onto the surface of the wafer W', so that a silicon oxide film is deposited on the wafer W'. This gas injector 1' is provided with five gas injector nozzles or slits. A slit 2' for TEOS is formed at the central portion of the gas injector 1'. Two slits 3A', 3B' for $N_2$ are formed on the opposite sides of the slit 2'. Two slits 4A', 4B' are respectively formed outside the slits 3A', 3B'

$N_2$ gas supplied through a $N_2$ gas line 9' is subjected to a flow rate control by a mass flow controller 6' and supplied to a bubbler 5' in which TEOS is stored. TEOS is in a liquid state at ordinary temperature and bubbled at a predetermined temperature under the action of $N_2$, and then ejected from the slit 2' together with $N_2$. $N_2$ gas to be ejected from the slits 3A', 3B' is supplied through a $N_2$ gas line 10' and subjected to a flow rate control of a $N_2$ mass flow controller 7'. $O_3$ gas to be ejected from the slits 4A', 4B' is supplied through a $O_3$/$O_2$ gas line 11' and is subjected to a flow rate control under the action of a $O_3$/$O_2$ mass flow controller 8'. TEOS and $O_3$ ejected from the slits are separated from each other by $N_2$ (serving as a curtain) ejected from the slits 3A, 3B, so that TEOS and $O_3$ cannot be mixed before coming near the surface of the wafer W'. This is intended to avoid reaction between TEOS and $O_3$ in gas phase thereby to suppress generation of particle as much as possible.

However, difficulties have been encountered in the above-discussed plasma CVD system using the postmixing method, in which the polymerization reaction of TEOS under the action of oxygen radical resulting from decomposition of $O_3$ becomes difficult thereby degrading the properties (for example, the etching rate) of the resultant silicon oxide film. This is guessed to be occur owing to lowering in contact probability between oxygen radical and TEOS molecular thus making an insufficient polymerization reaction.

As a countermeasure for the above difficulties, it may be proposed to lower the flow rate of $N_2$ gas ejected from the slits 3A, 3B under the action of the mass flow controller 7 or to make the flow rate zero. This makes the postmixing method approach the premixing method, and therefore it seems that the polymerization of TEOS proceeds to improve the film properties and quality of silicon oxide. However, there arise problems in which the substrate dependency is strengthened owing to the oligomer produced by the polymerization reaction, so that the film properties are lowered particularly on a hydrophilic surface of the substrate.

SUMMARY OF THE INVENTION

It is an object of the present invention to provide an improved CVD method and a system for accomplishing the method, by which drawbacks encountered in conventional CVD methods and systems can be effectively overcome.

Another object of the present invention is to provide an improved CVD method and a system for accomplishing the method, by which the properties and quality of a silicon oxide film deposited on a substrate can be effectively improved while lowering a so-called substrate dependency of the deposited silicon oxide film in silicon oxide film deposition using a reaction between an organic Si source and $O_3$.

An aspect of the present invention resides in a CVD method comprising the following steps: moving a substrate in a predetermined direction, a silicon oxide film being to be deposited on the substrate; and ejecting the following gases to a surface of the substrate in the order named or sequence set forth: a first gas containing $O_3$, a second gas which is inert to a reaction between an organic Si source and $O_3$, a third gas containing the organic Si source, a fourth gas which is inert to the reaction, a fifth gas containing the organic Si source, a sixth gas which is inert to the reaction, and a seventh gas containing $O_3$; and controlling a flow rate of the second and sixth gases.

Another aspect of the present invention resides in a CVD system comprising a device for moving a substrate in a predetermined direction, a silicon oxide film being to be deposited on the substrate. A gas injector is provided to eject gases containing an organic Si source and $O_3$ to a surface of the substrate. The gas injector includes a first nozzle for ejecting a gas containing $O_3$, a second nozzle for ejecting a gas which is inert to a reaction between the organic Si source and $O_3$, a third nozzle for ejecting a gas containing the organic Si source, a fourth nozzle for ejecting a gas which is inert to the reaction, a fifth nozzle for ejecting a gas containing the organic Si source, a sixth nozzle for ejecting a gas which is inert to the reaction, and a seventh nozzle for ejecting a gas containing $O_3$. Additionally, the first to seventh nozzles are arranged in the order named or sequence set forth in the predetermined direction.

Consequently, according to the present invention, the properties and quality of a silicon oxide film deposited on a substrate can be effectively improved while lowering a so-called substrate dependency of the deposited silicon oxide film during a deposition process under a CVD method using a reaction between an organic Si source and $O_3$, for example, an atmospheric TEOS-$O_3$-CVD method which exhibits a relatively high substrate dependency of the deposited film to the substrate during deposition of a CVD film. As a result, the present invention prevents an increase in number of production steps, for example, owing to addition of special pretreatments such as a plasma treatment and an ethanol coating, while suppressing an equipment cost increase for production.

Additionally, by lowering the flow rate of the second inert gas (ejected from the second nozzle) as compared with the sixth inert gas (ejected from the sixth nozzle), first a treatment by the postmixing method is accomplished, and thereafter a film deposition by the premixing method is made. More specifically, first the postmixing method is accomplished to momentarily deposit a thin silicon oxide film which is less in the substrate dependency, on the whole surface of the substrate. Immediately thereafter, the premixing method is accomplished to deposit a silicon oxide film of excellent properties and high quality.

BRIEF DESCRIPTION OF THE DRAWINGS

In the drawings, like reference numerals designate like parts and elements throughout all figures in which.

DETAILED DESCRIPTION OF THE INVENTION

Figure 3:
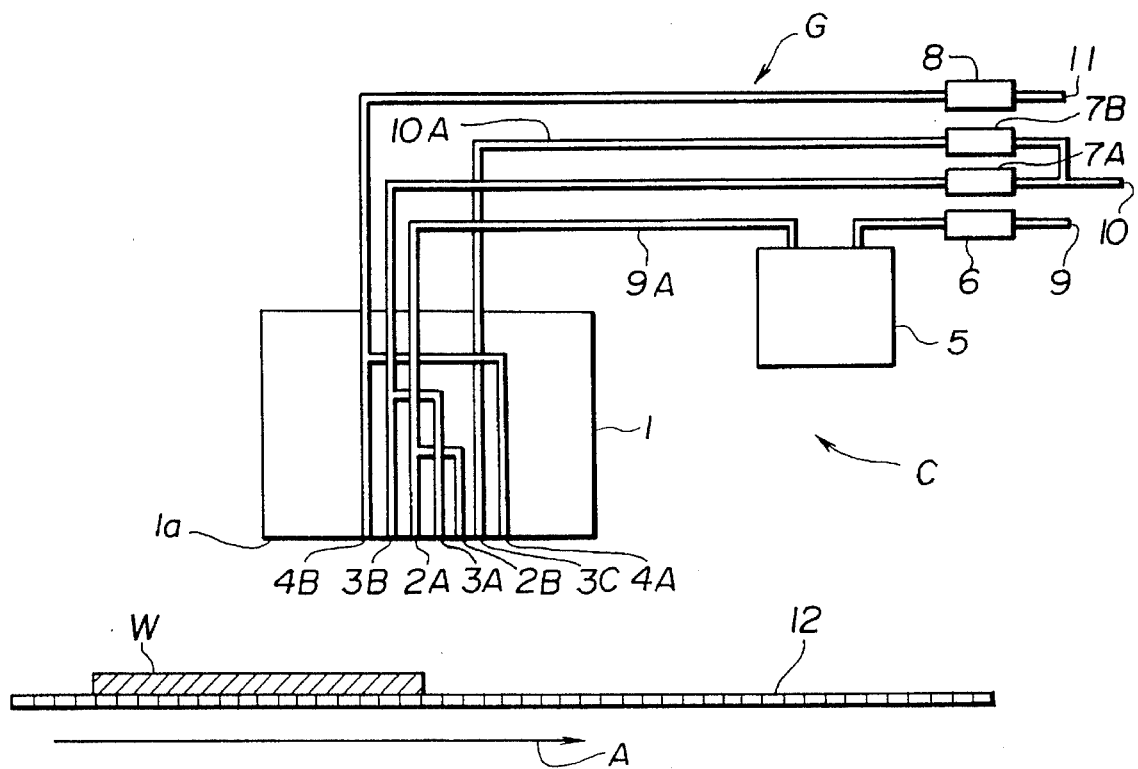
FIG. 3 is a schematic illustration of an embodiment of a CVD system according to the present invention.

Referring now to FIG. 3, an embodiment of a CVD system according to the present invention is illustrated by the reference character C. The CVD system C in this embodiment is an atmospheric pressure CVD system for accomplishing an atmospheric pressure TEOS(tetra ethoxy silane)-$O_3$-CVD method. The CVD system C comprises a gas supply system G including a gas injector 1 which is provided with a plurality of gas injector slits or nozzles 2A, 2B, 3A, 3B, 3C, 4A, 4C for ejecting gas to the surface of a wafer W which is put on a conveyer belt 12. The conveyer belt 12 moves in a wafer moving direction indicated by an arrow A. Accordingly, all the slits are formed at the bottom surface 1a of the gas injector 1 and localable to face the top surface of the wafer W.

The slits 2A, 2B for ejecting TEOS are formed at the central portion of the gas injector bottom surface 1a. The slits 2A, 2B are fluidly connected to a bubbler 5 in which TEOS is stored. TEOS is liquid at an ordinary temperature and therefore bubbled with $N_2$ gas in the bubbler 5. The bubbler 5 is in turn fluidly connected to a mass flow controller 6 to control the flow rate of $N_2$ gas flowing a $N_2$ gas line 9. $N_2$ gas is supplied to the $N_2$ gas line upstream of the controller 6. The slit 2B is located on the rear side of the slit 2A relative to the wafer moving direction A. The slits 3A, 3B for ejecting $N_2$ are located respectively on the front and rear sides of the slit 2A relative to the wafer moving direction A and fluidly connected to a $N_2$ mass flow controller 7A through a $N_2$ gas line 10 to which $N_2$ gas is supplied. The slit 3C for ejecting $N_2$ is fluidly connected through a $N_2$ gas line 10A to a $N_2$ mass flow controller 7B which is in turn fluidly connected to the $N_2$ gas line 10 upstream of the mass flow controller 7A. The slit 3C is located on the rear side of the slit 2B relative to the wafer moving direction A. The slits 4A, 4B for ejecting $O_3/O_2$ (mixture of $O_3$ and $O_2$) are located respectively on the rear side of the slit 3C and on the front side of the slit 3B. The slits 4A, 4B are fluidly connected to a $O_3/O_2$ mass flow controller 8 through a $O_3/O_2$ gas line 11. $O_3/O_2$ gas is supplied to the gas line 11 upstream of the mass flow controller 8. It will be understood that the slits are arranged in the order of 4B, 3B, 2A, 3A, 2B, 3C, 4A in the wafer moving direction A, as shown in FIG. 3.

With this arrangement, the wafer W moves in the direction A and passes through a location under the bottom surface 1a of the gas injector 1, so that the upper surface of the wafer W is subjected to gas ejection from the slits in the order of 4B, 3B, 2A, 3A, 2B, 3C, 4A. At this time, reaction is made between TEOS from the slits 2A, 2B and $O_3$ from the slits 4A, 4B to form a polymer which results in deposition of a silicon oxide film (not shown) on the top surface of the wafer W.

It is preferable to reduce the flow rate of $N_2$ gas ejected from the slit 3C as compared with that of $N_2$ gas ejected from the slits 3A, 3B, by which reaction between TEOS from the slit 2B and $O_3$ from the slit 4B approaches that of the premixing method thereby promoting polymerization reaction of TEOS.

The reaction of CVD under the postmixing method is ensured under the action of the slit 2A for TEOS, the slits 3A, 3B for N₂ and the slit 4B for O₃. Accordingly, the formation of silicon oxide film at an initial period of deposition is accomplished under the postmixing method which hardly exhibits the substrate dependency. At a period after the initial period, a continuous formation or deposition of the silicon oxide film can be made under the premixing method thereby to promote the polymerization of TEOS thus obtaining a silicon oxide film of excellent properties and high quality.

Figure 1:
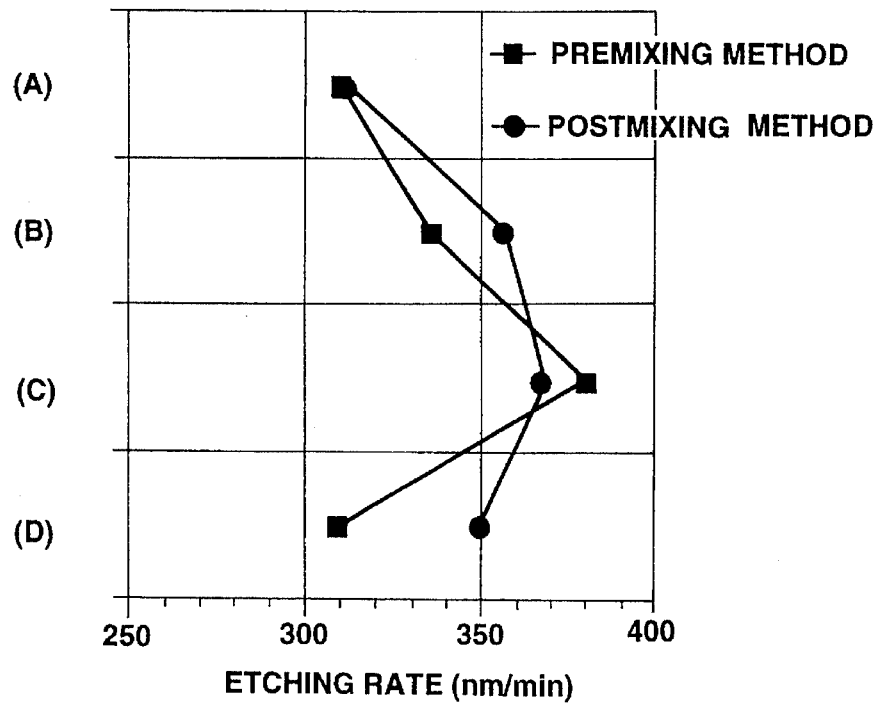
FIG. 1 is a graph showing the relationship between an etching rate and surface conditions of a substrate with respect to a premixing method and a postmixing method.
Figure 2:
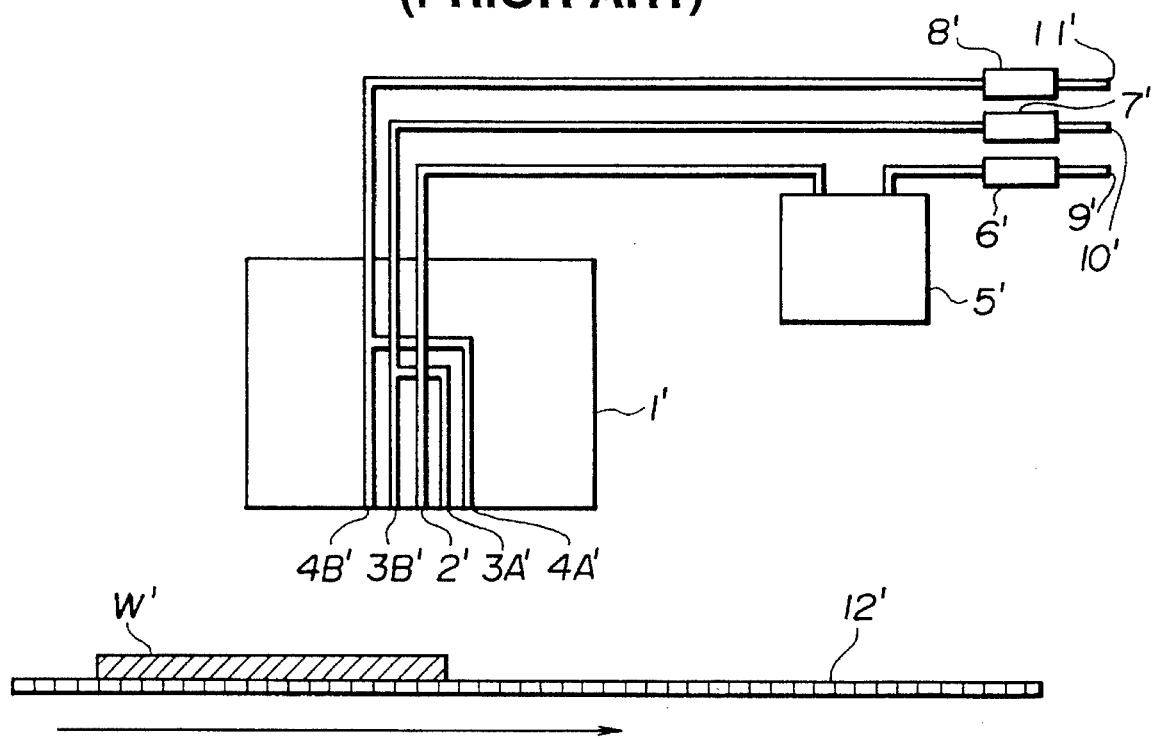
FIG. 2 is a schematic illustration of a conventional CVD system.

In this embodiment, a line 9A for supplying TEOS is bifurcated into two portions to lead to the slits 2A, 2B so that the flow rate of TEOS in each slit 2A, 2B is about ½ of that in the slit 2' of the conventional CVD system shown in FIG. 2. As a result, the thickness of the deposited film of silicon oxide obtained by each of the postmixing and premixing methods is about ½ of that of the conventional CVD system. It will be understood that the deposited film obtained by the postmixing method has a characteristics which hardly exhibit the substrate dependency but somewhat low in film quality, and therefore it is preferable to make the deposited film thickness thin as much as possible.

In case that zero flow rate of N₂ in the slit 3C is optimum, it is sufficient to fully close the N₂ mass flow controller 7B, so that it is possible to change the condition of the gas supply system G in accordance with the magnitude of the substrate dependency of the deposited film of silicon oxide to the substrate.

Figure 4:
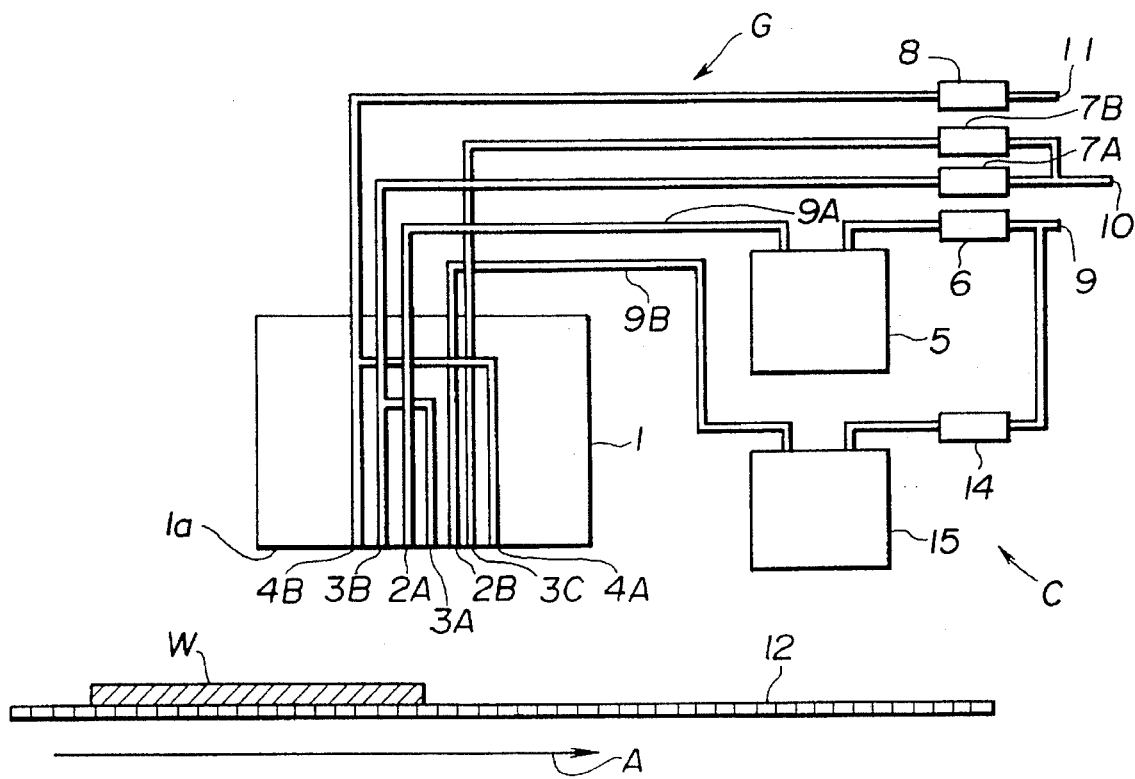
FIG. 4 is a schematic illustration of another embodiment of the CVD system according to the present invention.

FIG. 4 illustrates another embodiment of the CVD system C according to the present invention, similar to the embodiment of FIG. 3 except for the arrangement of the gas supply lines for TEOS. Also in this embodiment, the CVD system C is an atmospheric pressure CVD system for accomplishing an atmospheric pressure TEOS(tetra ethoxy silane)-O₃-CVD method. This CVD system C comprises the gas supply system G which includes the gas injector 1.

In this embodiment, the slits 2A, 2B for TEOS are independently fluidly connected to the bubbler 5 and an additional bubbler 15 through the gas supply line 9A and an additional gas supply line 9B, respectively, in order to independently control the flow rate of TEOS ejected from each slit 2A, 2B. The bubbler 15 is fluidly connected to an additional mass flow controller 14 which is in turn fluidly connected to the N₂ gas line 9. The bubbler 15 contains therein TEOS to be bubbled with N₂ gas from the mass flow controller 14. Accordingly, N₂ gas supplied from the N₂ gas line 9 is subjected to a flow rate control by the mass flow controller 14 and then introduced into the bubbler 15 to bubble TEOS. The bubbled TEOS is ejected together with N2 gas through the slit 2B.

Also in this embodiment, in case that zero flow rate of N2 from the slit 3C for N2 is optimum, it is sufficient to fully close the N2 mass flow controller 7B.

As appreciated from the above discussed embodiments, it is possible to make ejection of the organic Si source and O3 by using mainly the premixing or postmixing method, or by using both the premixing and postmixing methods. It is preferable to make larger the flow rate of N₂ in the slit 3B than that in the slit 3C so that the silicon oxide film deposition by the postmixing method is made at a timing at which the wafer W reaches to the location immediately under the gas injector 1 thereby solving the problems encountered in the above discussed conventional CVD system.

Although only the embodiments of FIGS. 3 and 4 have been discussed, it will be understood that the invention is not limited to the details of construction and arrangement of parts illustrated in the accompanying drawings and description, so that obviously modifications and variations are possible in light of the above teachings. For example, while only TEOS has been shown and described to be used as the organic Si source, it will be appreciated that OMCTS (octa methyl cyclotetra siloxane), TPOS (tetra propoxy silane), TMCTS (tetra methyl cyclo tetra siloxane) or the like may be used for the organic Si source.

What is claimed is:

1. A thermal CVD method for depositing a silicon oxide film on a substrate comprising the steps of:

providing a gas injector for injecting gases toward a surface of a substrate;

moving a substrate in a predetermined direction adjacent the gas injector; and ejecting the following gases in the order named to a surface of the substrate:
a first gas containing O₃;
a second gas which is inert to a reaction between an organic Si source and O₃;
a third gas containing the organic Si source;
a fourth gas which is inert to the reaction;
a fifth gas containing the organic Si source;
a sixth gas which is inert to the reaction; and
a seventh gas containing O₃, the flow rate of the second gas being higher than the flow rate of the sixth gas such that deposition of the silicon oxide film proceeds by a postmixing method and thereafter by a pre-mixing method as the substrate is moved in said predetermined direction past said gas injector.

2. A thermal CVD apparatus comprising:

a gas injector for ejecting gases containing an organic Si source and O₃ toward a surface of a substrate, said gas injector having a plurality of linearly adjacent nozzles including:
a first nozzle for ejecting a gas containing O₃;
a second nozzle for ejecting a gas which is inert to a reaction between the organic Si source and O₃;
a third nozzle for ejecting a gas containing the organic Si source;
a fourth nozzle for ejecting a gas which is inert to the reaction;
a fifth nozzle for ejecting a gas containing the organic Si source;
a sixth nozzle for ejecting a gas which is inert to the reaction; and
a seventh nozzle for ejecting a gas containing O₃; and means for moving a substrate in a predetermined direction with respect to the gas injector from the first nozzle to the seventh nozzle, whereby a silicon oxide film is deposited on the substrate as it moves past the gas injector.

3. A CVD apparatus as claimed in claim 2, wherein said gas injector has an ejection surface which is locatable immediately above and parallel with the surface of said moved substrate, said first to seventh nozzles being opened at said ejection surface to eject gas.

4. A CVD apparatus as claimed in claim 2, wherein said gas containing organic Si source is one selected from the group consisting of TEOS (tetra ethoxy silane), OMCTS (octa methyl cyclotetra siloxane), TPOS (tetra propoxy silane), and TMCTS (tetra methyl cyclo tetra siloxane).

5. A CVD apparatus as claimed in claim 2, wherein said inert gas is N₂ gas.

6. A thermal CVD apparatus as defined in claim 2, further comprising means for setting a flow rate of gas through each nozzle and wherein the flow rate of gas through the second nozzle is higher than the flow rate of gas through the sixth nozzle, such that deposition of the silicon oxide film proceeds by a postmixing method and thereafter by a premixing method as the substrate is moved past the gas injector from the first nozzle to the seventh nozzle.

* * * * *